United States Patent [19]

Philipossian

[11] Patent Number: 4,992,044
[45] Date of Patent: Feb. 12, 1991

[54] REACTANT EXHAUST SYSTEM FOR A THERMAL PROCESSING FURNACE

[75] Inventor: Ara Philipossian, Stoneham, Mass.

[73] Assignee: Digital Equipment Corporation, Maynard, Mass.

[21] Appl. No.: 372,663

[22] Filed: Jun. 28, 1989

[51] Int. Cl.[5] .................. F27D 5/00; F27D 7/02
[52] U.S. Cl. .................... 432/253; 432/152; 432/241; 118/715
[58] Field of Search .......... 432/5, 6, 11, 152, 253, 432/72, 2, 99; 118/715, 725; 156/345

[56] References Cited

U.S. PATENT DOCUMENTS

| | | | |
|---|---|---|---|
| 4,347,431 | 8/1982 | Pearce et al. | 219/390 |
| 4,375,027 | 2/1983 | Zeto et al. | 219/390 |
| 4,401,254 | 8/1983 | Tramontini | 228/217 |
| 4,411,619 | 10/1983 | Darnell et al. | 432/1 |
| 4,459,104 | 7/1984 | Wollman | 432/123 |
| 4,526,534 | 7/1983 | Wollman | 432/11 |
| 4,543,059 | 9/1985 | Whang et al. | 432/11 |
| 4,711,197 | 12/1987 | Taylor, Sr. | 118/715 |

FOREIGN PATENT DOCUMENTS 0211914  9/1987  Japan .................... 118/715

Primary Examiner—Henry A. Bennet
Assistant Examiner—C. Kilner
Attorney, Agent, or Firm—Arnold, White & Durkee

[57] ABSTRACT

A furnace used for high-temperature processing of semiconductor wafers employs a scavenger arrangement for removing effluent reactant gases which provides radial symmetry of gas flow. A scavenger chamber surrounds one end of a cylindrical furnace, and draws exhaust gases outward by a pressure differential. The scavenger chamber has a cylindrical quartz liner having a number of openings therein, the openings being circumferentially spaced about the end of the furnace so that gas flow is uniform and symmetrical. Preferably, these openings are in a plurality of groups, spaced from one another.

17 Claims, 2 Drawing Sheets

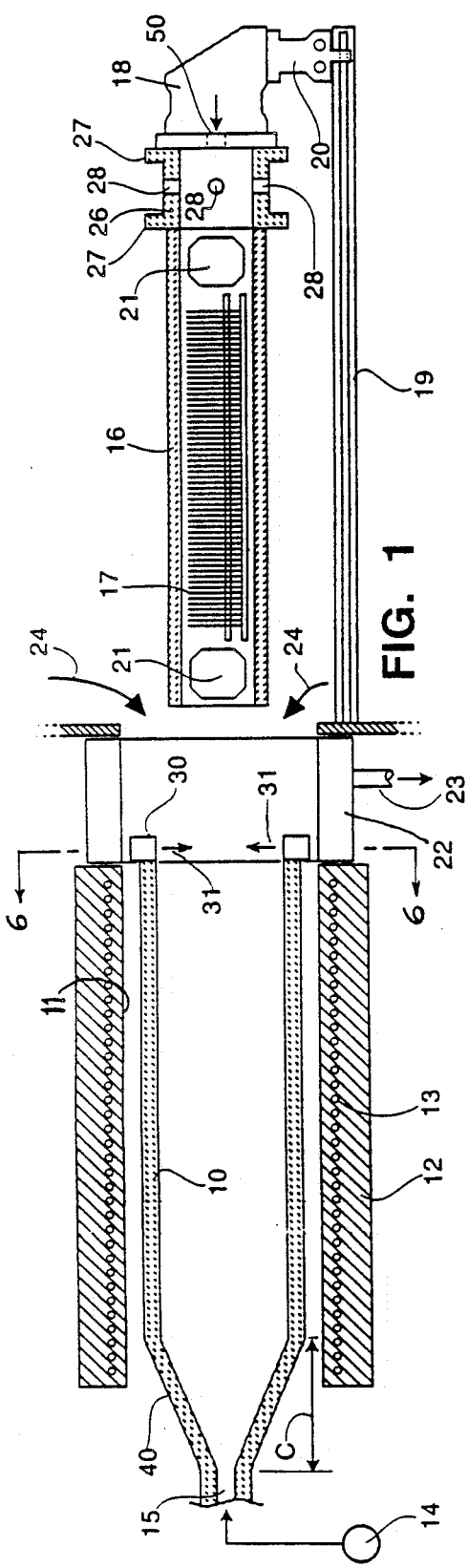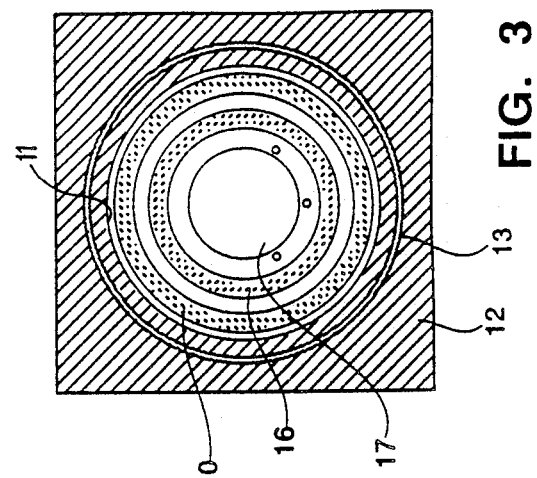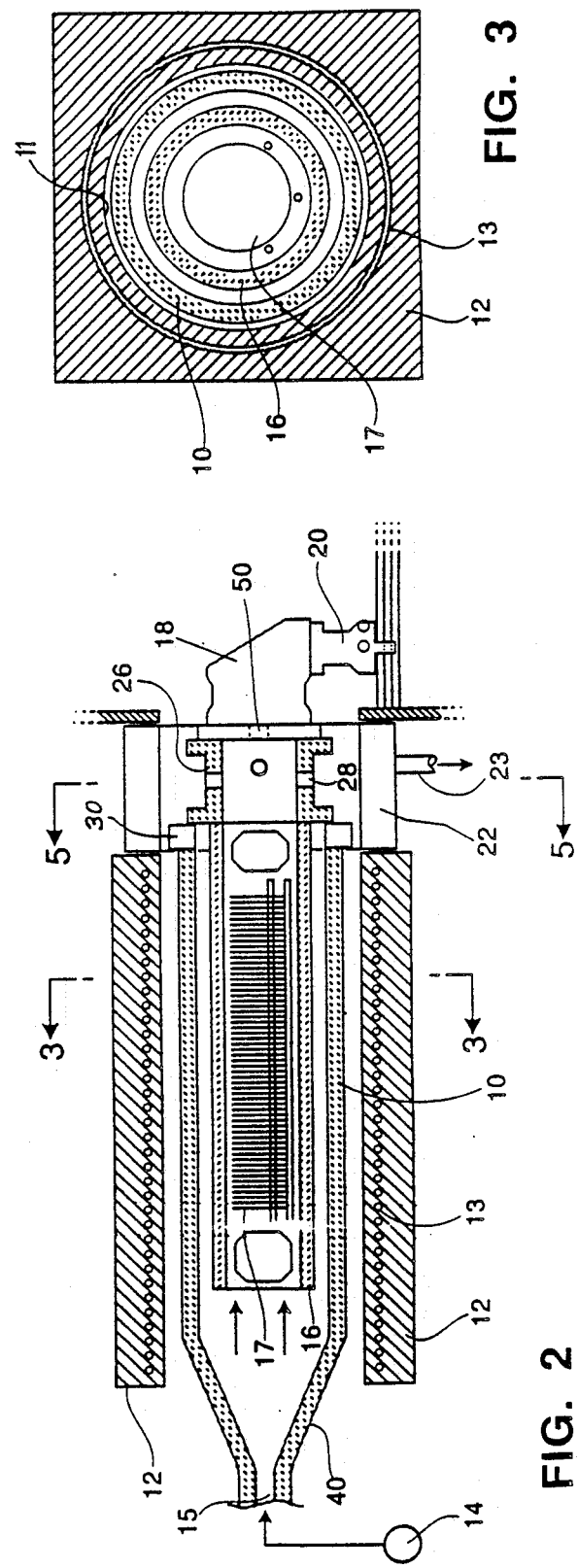

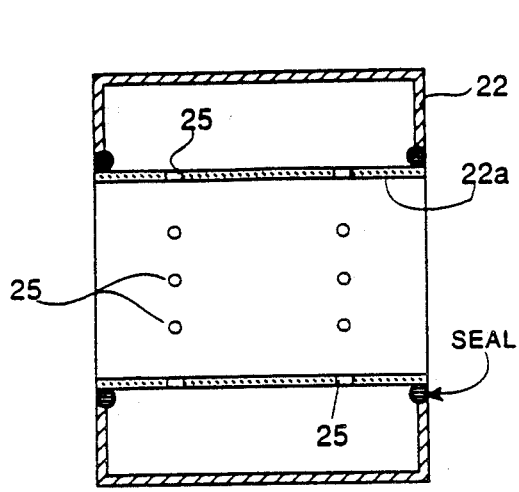
FIG. 4
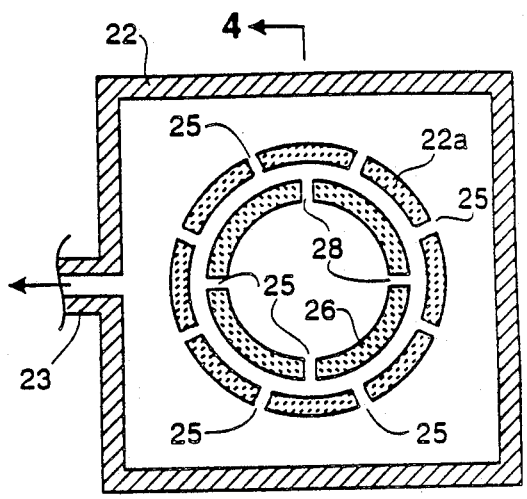
FIG. 5
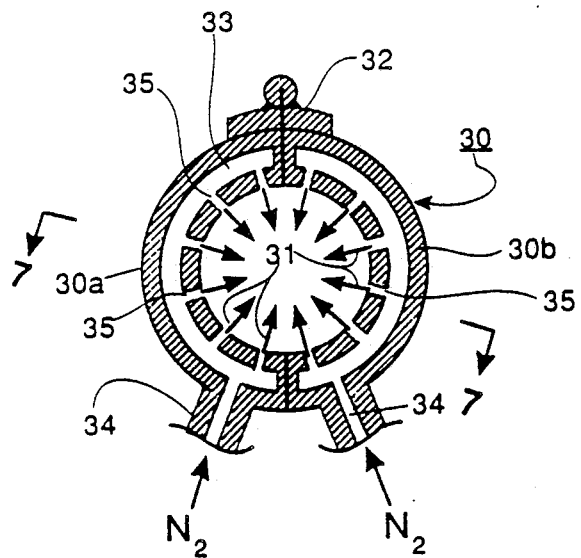
FIG. 6
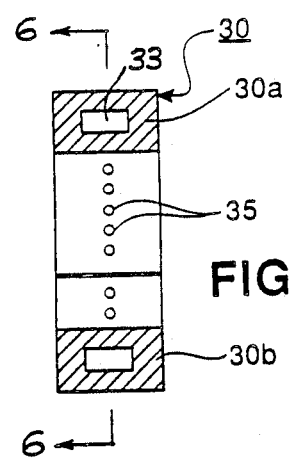
FIG. 7
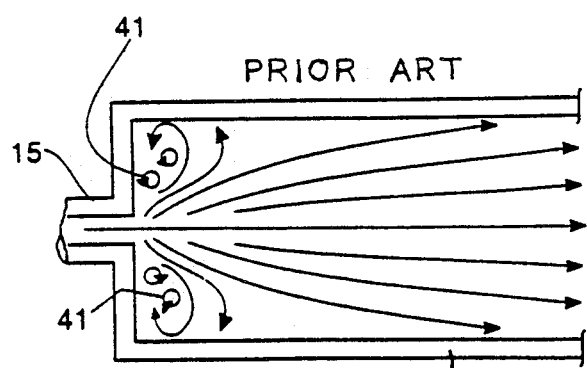
FIG. 8 PRIOR ART
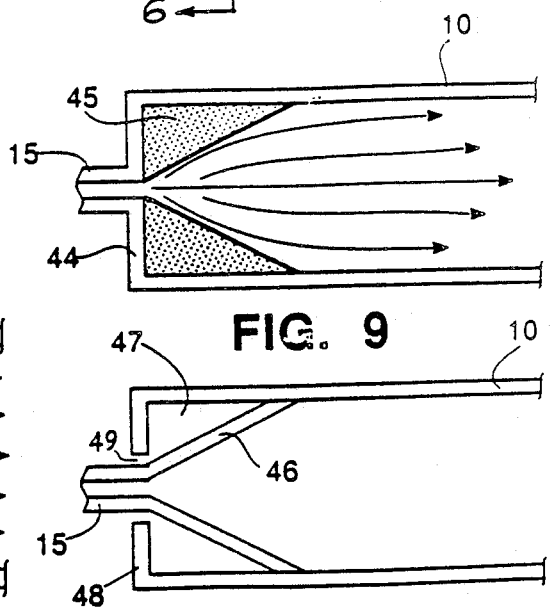
FIG. 9
FIG. 10

4,992,044

REACTANT EXHAUST SYSTEM FOR A THERMAL PROCESSING FURNACE

RELATED CASES

This application discloses subject matter also disclosed in my copending patent application Ser. Nos. 372,669 and 372,672, filed concurrently herewith, assigned to Digital Equipment Corporation, assignee of this invention.

BACKGROUND OF THE INVENTION

This invention relates to semiconductor processing equipment, and more particularly to apparatus for performing high-temperature processes upon semiconductor wafers in a thermal processing furnace.

Various types of thermal processing equipment are available commercially. During a process cycle, several boats containing silicon or other kind of wafers, supported by some kind of rod, are inserted into the furnace where the desired process is performed. Upon completion of the process cycle, the wafers are removed from the furnace and unloaded from the supporting rod. During the insertion and removal steps of the process, it is preferred that the wafers be protected from exposure to ambient air. Oxygen, water vapor and airborne particulates found in ambient air can react with the wafers and adversely affect their chemical and physical properties. One very convenient apparatus to do this has been described in U.S. Pat. Nos. 4,459,104 to Wollman and 4,543,059 to Whang et al, which describe a tubular cantilever into which the loaded wafer boats are inserted. By means of the tube, the wafers are protected against particulates, and, by flowing an inert gas through the tube, also protected from moisture and air. This is particularly important during the cantilever insertion and removal steps of a typical thermal process cycle. The tubular cantilever also reduces the amount of contaminants seen by the wafers inside the furnace tube itself since the wafer is isolated by the tubular cantilever from the furnace tube.

Further, it is important that the reaction or other processing step being performed on the wafers be carried out uniformly on all the wafers being processed, and uniformly across the surface of each wafer. Various furnace design changes have been made to assure a uniform flow of the reaction gases through the furnace tube to prevent contaminants from entering the reaction tube and adversely affecting the wafers, and to ensure efficient removal of the gases fed to the furnace.

Various diffusion furnaces have used scavenger boxes to remove these gases. These are essentially cubic in shape, with an exit port located on one side of the scavenger box. In particular, in the scavenging arrangement of the U.S. Pat. No. 4,543,059, as an example, the tubular cantilever has a provision for reactant gas exhaust through the geometric center of the end of the tube, with a curved exhaust spout used to direct the effluent stream outward and toward the vicinity of the scavenger exhaust port. There are several inherent disadvantages of this structure. First, as the gases exit the reaction chamber (i.e., the annular section between the furnace tube and the tubular cantilever) they are immediately exposed to the cubic scavenger box. The box has a very non-uniform, non-symmetrical flow pattern due to its single scavenger exhaust port. Such an abrupt change in geometry can result in radial pressure gradients at the loading/unloading end of the furnace and can tend to increase the amount of ambient air infiltration into the reaction chamber. Furthermore, the unidirectional flow pattern can stir up airborne or otherwise stationary particulates and redirect them into the reactor. The same problems, to a lesser extent, can be caused by the reactant gases which exit the inner annular section, between the tubular cantilever and the semiconductor wafers. Second, during wafer load-out, the hot wafer/cantilever load is exposed to the interior wall of the scavenger box; since oxidations are performed in the presence of corrosive, chlorine-containing compounds, stainless steel can corrode with time and leach onto the quartz tubular cantilever. Such leach products will result in high mobile ion levels as well as high defect densities associated with oxide films. Third, it is known that attaining symmetry in an oxidation reaction chamber is essential to obtain the desired high level of within-wafer and wafer-to-wafer thickness uniformities; such uniformities minimize variations in electrical characteristics of oxide films in the semiconductor devices being produced. Even though the reaction zone may appear symmetrical, an asymmetric exhaust section can seriously affect the overall symmetry of the reactor and yield wafers having a large variability in electrical and compositional characteristics.

SUMMARY OF THE INVENTION

A thermal processing furnace is fitted with a symmetric scavenger for effluent reactant gases which provides radial symmetry of gas flow at the end of the furnace. This scavenger draws spent gases outward by a pressure differential. An internal quartz lining for the scavenger has a number of openings circumferentially spaced about the end of the furnace tube so that gas flow distribution in the radial direction is more uniform.

In the case where a tubular cantilever is employed as described above, the end of the cantilever tube may also have a number of openings for gas exhaust, and these openings may be positioned with respect to the openings in the scavenger so as to maximize the radial uniformity of the exhaust gases.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment, i.e., a tubular cantilever system, which follows, when read in conjunction with the accompanying drawings, wherein:

FIG. 1 is an elevation view in section of an atmospheric thermal processing furnace having a tubular cantilever in which features of the invention may be implemented, the furnace in this view being in a condition where the tubular cantilever is outside the furnace;

FIG. 2 is an elevation view in section of the furnace of FIG. 1, the furnace in this view being in a condition where the tubular cantilever is inside the furnace;

FIG. 3 is an elevation view in section of the apparatus of FIG. 2, taken along the line 3—3 in FIG. 2;

FIG. 4 is a sectional view of the scavenger box of FIGS. 1 and 2;

FIG. 5 is an elevation view in section of the scavenger box seen in FIGS. 1, 2 and 4, taken along the line 5—5 in FIG. 2;

FIG. 6 is an elevation view in section of the collar 31 seen in FIGS. 1 and 2, taken along the line 6—6 in FIG. 1;

FIG. 7 is an elevation view in section of the collar 31 seen in FIGS. 1, 2 and 6, taken along the line 7—7 in FIG. 6;

FIG. 8 is an elevation view in section of a gas inlet nozzle for a tube furnace according to the prior art;

FIG. 9 is an elevation view in section of a gas inlet nozzle for a tube furnace according to an alternative method of construction;

FIG. 10 is an elevation view in section of a gas inlet nozzle for a tube furnace, similar to FIGS. 8 and 9, according to an alternative method of construction.

DETAILED DESCRIPTION OF SPECIFIC EMBODIMENT

Although the following description and the Drawing refer specifically to one embodiment of a furnace of the invention having a tubular cantilever for carrying the wafers, the scavenger of the invention can be used with any other thermal processing furnace, as will be known to one skilled in the art.

Referring to FIGS. 1, 2 and 3, a furnace for processing semiconductor wafers is illustrated according to features of one embodiment of the invention. This assembly includes an elongated cylindrical quartz furnace tube 10 located inside a cylindrical opening 11 of a diffusion furnace 12. The diffusion furnace 12 includes heater elements 13 of the resistance type functioning to raise the temperature within the furnace to an elevated level of perhaps 800° C. to about 1150° C. for performing some step of a semiconductor manufacturing process, such as diffusion, LPCVD (low pressure chemical vapor deposition), oxide growth, annealing, or the like. A source 14 of reactant or inert gas is connected to an inlet 15 at one end of the tube 10 to provide the desired atmosphere within the tube at various times in the operating cycle. Since the apparatus in one embodiment is intended to accommodate 6-inch diameter silicon wafers, the furnace tube 10 has a diameter of about 10-inch, although the particular size is selected according to the intended use of the system. A quartz tubular cantilever 16 holds a large number of these silicon wafers 17, and this tube is moved to a position out of the furnace as seen in FIG. 1 for loading or unloading the wafers or to a position within the furnace as seen in FIG. 2 for performing the high-temperature furnace operation; this position of FIG. 2 is also used for idling the furnace system for extended times, in which case there are no wafers 17 in place. The tubular cantilever 16 is supported at its outward end by a fixture 18 mounted on a track 19 by a slidable dolly 20. Construction of the tubular cantilever and track mechanism is disclosed in the above-mentioned U.S. Pat. Nos. 4,459,104 and 4,543,059.

While the tubular cantilever 16 is within the furnace as seen in FIG. 2, gas flow from the inlet 15 moves in the left-to-right direction indicated by arrows through the tube 16 to provide the desired atmosphere for the reaction or deposition intended. The composition of this gas is selected by the gas source 14 in accordance with the usual practice. Baffles 21 are positioned in the tubular cantilever 16 on both sides of the wafers 17 to retard loss of heat and to ensure adequate reactant mixing, but yet to allow free flow of reactant gases. Although a particular embodiment is shown in the Drawing, many other baffle arrangements are known and can be substituted by one skilled in the art. The spent or exhaust gases are collected in a scavenger box 22, for which an outlet 23 is maintained at below ambient pressure so that effluent reactant gases will be drawn into the scavenger box 22 rather than leaking out into the ambient outside the furnace. When the tubular cantilever 16 is in the outmost position, as seen in FIG. 1, the face of the furnace is open and ambient air or gas can enter the tube furnace as indicated by arrows 24; the scavenger box functions also to draw this ambient air or gas into the scavenger box 22 for exhaust by the outlet 23 rather than allowing it to reach the furnace tube 10. This is undesirable because ambient air, aside from being reactive, contains high levels of particulates and other contaminants. Air should be prevented from entering the furnace tube at all times.

It is important that radial symmetry be provided for the gas flow into the scavenger box 22 from the furnace tube 10 or from the interior of the tubular cantilever 16. To this end, as illustrated in the detail view of FIG. 4, the openings for the flow of gas are a symmetrical array of openings 25 arranged in two cylindrical rings or bands, with the bands spaced apart by about a 4-inch distance. In one embodiment, there are sixteen of these openings 25, arrayed in two bands of eight each. The number and size of openings, their spacing, etc., are dependent upon the particular size of the furnace, gas flow rates, and the like. The openings 25 are formed in a cylindrical quartz inner liner 22a of the scavenger box 22; the fact that this section is made of quartz reduces contamination considerably, since a stainless steel tube would be susceptible to corrosion due to exiting chlorine-containing chemicals and thus would cause a contamination concern. The ends of the scavenger box 22 must be sealed so as to be airtight to prevent gases from exiting the scavenger box 22 from any channel other than the openings 25.

Referring again to FIG. 1, at the outer end of the tubular cantilever 16 is a cylindrical quartz section 26 having a pair of flanges 27, serving as an extension of the tubular cantilever 16, and this section has a number of symmetrically-disposed openings 28, also seen in the section view of FIG. 5, which provide radially-symmetrical flow of exhaust gases, acting together with the two rows of openings 25 of the scavenger box 22. In the example embodiment four of these openings 28 are provided, although their particular number, size and configuration, i.e., the number of bands or rings, are dependent upon the factors mentioned above. When the tubular cantilever 16 is inside the furnace 12 as seen in FIGS. 2 or 5, the openings 28 in the end-section 26 are axially positioned about half-way between the positions of the openings 25 in the scavenger box 22.

According to a feature of the invention disclosed in my copending application Ser. No. 372,669, filed concurrently herewith, a symmetrical manifold collar 30 surrounds the end of the furnace tube 10 and provides symmetrical injection of inert gas such as nitrogen gas, as indicated by the arrows 31. This injection only occurs when the tubular cantilever 16 is in the outermost position as seen in FIG. 1, or is being moved to or from the position of FIG. 2. According to one embodiment, as seen in FIG. 6, the collar 30 is split into two sections, 30a and 30b, which are rotatable about a hinge-like connection 32, i.e., the two halves 30a and 30b may be opened up to facilitate installation and removal, since the collar 30 must be removed from the furnace tube 10 for cleaning. The collar halves 30a and 30b each consist of a stainless steel, hollow, half-cylindrical section having an inner chamber 33 into which an inert gas is forced from an inlet 34, and having a number of nozzles or holes 35 producing the inwardly-projecting nitrogen curtain as indicated by the arrows 31. The collar halves 30a and 30b can also be made of other materials, such as silicon, silicon carbide, or quartz. The collar can also be of unitary construction with two points for injection of the inert gases. The volume of gas needed to provide the desired inert gas curtain depends upon the various dimensions of the furnace in a particular application, but in the example embodiment is a few hundred liters/minute flowing into the two inlets 34. The inert gas, e.g., nitrogen, exiting from the openings 35 forms a barrier or curtain, which is drawn out by the scavenger box 22 through the two sets of openings 25. Inert gas is also being forced through the furnace tube 10 at this time from the inlet 15, so the interior of the tube 10 is at a higher pressure than the ambient and the interior of the scavenger box 22; these pressure differentials along with the curtain effect are such that ambient air entering as indicated by arrows 24 will not reach the interior of the furnace tube 10 but instead will be harmlessly drawn out by the scavenger box 22.

According to the invention disclosed in my copending application Ser. No. 372,672, filed concurrently herewith, the shape of the inlet end of the quartz furnace tube 10, between the gas inlet 15 and the cylindrical body of the tube where the wafers will reside, defines a cone-like shape 40. This shape suppresses the formation of re-circulating gas cells 41 near the point of injection which form when the inlet 15 admits directly to a cylindrical tube as seen in FIG. 8. That is, the flow of gas passing the sharp corners of the inlet of FIG. 8 results in circular gas cells 41, making it harder to purge the tube when changing from one gas flow to another. The abrupt change in velocity of the incoming gas is illustrated by comparing the cross-sectional area $A_1$ of the inlet 15 to the area $A_2$ of the furnace tube 10; the gas flow obeys the relationship $A_1*V_1=A_2*V_2$ so that if the area $A_2$ is one hundred times that of $A_1$ then the velocity within the inlet 15 will be one hundred times that in the furnace tube 10. This abrupt change in velocity, as well as physical shape and change in volume due to the pressure differential, results in the formation of re-circulating gas cells 41. Also, in going from a pre-oxidation interval to an oxidation step, or in going from an oxidation interval to a post-oxidation step, when the furnace is being used for oxidizing the wafers 17, the improved purging capability of the conical section 40 will reduce the time of process gas overlaps. As has been determined by the prior work of others, the optimum shape for suppressing re-circulation cells of entering reactant gases is obtained by increasing the curvature of the sidewalls of the nozzle in the direction of theoretical flow streamlines.

The conical-like shape 40 in a preferred embodiment extends an axial length "c" as seen in FIG. 1; the length "c" is at least about a length which exceeds the diameter of the tube 10. Particularly, in one embodiment, the length "c" is about 12-inches when the diameter of the tube furnace is 10-inches. The conical-like shape 40 can be obtained by shaping the quartz tube 10 itself to the desired configuration as seen in FIG. 1, or alternatively as seen in FIG. 9 the furnace tube 10 can be cylindrical with a flat end 44, and filler material 45 of quartz or other material added to create the conical-like shape needed for optimum gas flow.

It is preferable to maintain the outer cylindrical-like geometry of the quartz furnace tube 10 as illustrated in FIG. 9, rather than having a conical shape a seen in FIG. 1, because, from a mechanical standpoint, the cylindrical shape is less susceptible to breakage. Also, from a thermal standpoint, it is common practice to pack the nozzle end of furnace tubes with an insulating material to minimize heat losses from the rear of the furnace. Packing cylindrical-shaped tubes with insulating materials is much easier and more thermally efficient. Furthermore, since most furnaces are constructed for using cylindrical-shaped furnace tubes, the shape of FIG. 9 is more consistent with current furnace hardware, compared to that of FIG. 1.

Manufacturing the nozzle shown in FIG. 9 may be fairly labor intensive and will require a large amount of quartz material as the filler 45 to be able to effectively fill the space inside the tube and make it conical. Furthermore, such a tube would have a large mass and may act as a source of heat dissipation, or at least create thermal inertia. An alternative construction of the conical nozzle of the furnace tube is shown in FIG. 10, where the tube 10 is of cylindrical shape all the way to the end, but has a conical insert 46 to create the same inner conical geometry as FIGS. 1 or 9, to which the inlet 15 is integrally formed, but leaving a hollow interior annular chamber 47. This construction is much lighter since it does not need the filler 45, is easier to construct, and does not have the heat dissipation or inertia that the embodiment of FIG. 9 would have. It is preferable that the end piece 48 of the cylindrical tube 10 does not join with the inlet 15 but instead leaves an annular opening 49 so the chamber 47 is not sealed; if the chamber 47 were sealed then the gases inside the chamber would expand and crack the tube 10. Also the opening 49 is large enough to allow cleaning liquids to drain out when the furnace tube 10 has been removed and is being cleaned in a conventional tube etcher. If the opening 49 is not left, i.e., the end piece 48 extends all the way to the inlet 15, sealing the chamber 47, then the chamber must be evacuated during construction to leave a vacuum.

A typical operating sequence for the tube furnace described above with reference to FIGS. 1 and 2 is set forth in the following Table A. There are three gas sources in this apparatus; first, inert or reactant gas is introduced at the inlet 15 to the furnace tube 10 from the source 14; second, inert gas is introduced at an inlet 50 at the outer end of the tubular cantilever 16 to keep ambient gas from entering the tubular cantilever which can contaminate the wafers during loading, idle or cooldown phases of operation (of course, as mentioned above, if the separate tubular cantilever 16 is not used, then the gas inlet 50 is omitted); and, third, the curtain of inert gas is introduced at the collar 30 through inlets 34. Assuming that the idling condition of the furnace is when the tubular cantilever is inside the furnace, as shown in FIG. 2, and that nitrogen ($N_2$) is flowing through the inlet 15 of the furnace tube 10, the sequence of applying the three gases from the three sources is seen in Table A where the operational terms refer to movement of the tubular cantilever 16:

TABLE A

| Step | Time (Min.) | Tube $N_2$ | Curtain $N_2$ | Tubular Cantilever $N_2$ | Operation |
|---|---|---|---|---|---|
| 0 | — | Yes | No | No | Idle |

TABLE A-continued

| Step | Time (Min.) | Tube N₂ | Curtain N₂ | Tubular Cantilever N₂ | Operation |
|---|---|---|---|---|---|
| 1 | 20 | Yes | Yes | Yes | Unload (Pullout) |

(load product wafers 17 into boats and insert boats into tubular cantilever at this time)

| Step | Time (Min.) | Tube N₂ | Curtain N₂ | Tubular Cantilever N₂ | Operation |
|---|---|---|---|---|---|
| 2 | 20 | Yes | Yes | Yes | Purge |
| 3 | 20 | Yes | Yes | Yes | Load (Push-in) |
| 4 | 30 | Yes | No | No | Temp Ramp-Up |
| 5 | 10 | No (Ox.) | No | No | Oxidation |
| 6 | 30 | Yes | No | No | Anneal |
| 7 | 40 | Yes | No | No | Temp Ramp-Down) |
| 8 | 20 | Yes | Yes | Yes | Unload (Pull-out) |

(remove product wafers 17 from tubular cantilever 16 at this time)

| Step | Time (Min.) | Tube N₂ | Curtain N₂ | Tubular Cantilever N₂ | Operation |
|---|---|---|---|---|---|
| 9 | 20 | Yes | Yes | Yes | Load (Push-in) |
| 10 | — | Yes | No | No | Idle |

While this invention has been described with reference to a specific embodiment, this description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A thermal processing furnace comprising:
   (a) a tube furnace having an elongated cylindrical chamber open at one end for receiving a cantilever tube containing articles to be processed, the cantilever tube having circumferentially-spaced exhaust holes positioned near said one end when said cantilever tube is within said cylindrical chamber;
   (b) means for introducing reactant and/or inert gases into the other end of said chamber;
   (c) a gas scavenger chamber fixed to said cylindrical chamber surrounding said one end of said cylindrical chamber when said cantilever tube is within said cylindrical chamber radially outward of the position of said cantilever tube and having a plurality of openings spaced circumferentially around an inner cylindrical face of said scavenger chamber for providing radially symmetric outflow of exhaust gases from said furnace, the cantilever tube moving axially within the scavenger chamber whereby the scavenger chamber also provides removal of gases when said cantilever tube is in a position withdrawn from said cylindrical chamber.

2. Apparatus according to claim 1 wherein said plurality of openings in said scavenger chamber include two separate groups of openings, the two groups being axially spaced from one another.

3. A furnace for performing high-temperature processes upon semiconductor wafers, comprising:
   (a) a tube furnace having an elongated cylindrical heated chamber open at one end for receiving semiconductor wafers;
   (b) cantilever means for conveying said semiconductor wafers, said cantilever means including support means at an outer end for axial movement of the wafers into said chamber for performing said processes and out of said chamber for loading and unloading said semiconductor wafers;
   (c) means for introducing reactant and/or inert gases into the other end of said cylindrical chamber; and
   (d) a gas scavenger chamber fixed to and surrounding said one end of said cylindrical heated chamber and positioned to surround the outward end of said cantilever means when said wafers have been moved into said heated chamber, said scavenger chamber having a plurality of openings spaced circumferentially around an inner cylindrical face of said scavenger chamber for providing radially symmetrical outflow of exhaust gases from said outward end; wherein said cantilever means includes a tubular cantilever surrounding said wafers, said tubular cantilever having a plurality of openings spaced circumferentially around said outward end for exhaust of gases into said scavenger chamber; the scavenger chamber also exhausting gases from said one end of the cylindrical heated chamber when said tubular cantilever is in a position out of said chamber.

4. Apparatus according to claim 3 wherein said plurality of openings in said scavenger chamber include two separate groups of openings, the two groups being axially spaced from one another.

5. Apparatus according to claim 3 wherein said openings in said tubular cantilever are positioned in an area surrounded by said groups of openings in said scavenger chamber when said tubular cantilever has been moved into said cylindrical heated chamber.

6. Apparatus according to claim 3 wherein said tubular cantilever is a quartz tube, wherein said elongated cylindrical heated chamber includes a quartz furnace tube of diameter larger than said tubular cantilever, and wherein said scavenger chamber includes a cylindrical quartz liner in which said plurality of openings is formed.

7. Apparatus according to claim 3 wherein said tubular cantilever has a plurality of openings spaced circumferentially around said outward end and spaced from said outward end for exhaust of gases into said scavenger chamber when said tubular cantilever has been moved into said heated chamber.

8. A method of operating a furnace of the type used for performing high-temperature processes upon semiconductor wafers, comprising the steps of:
   (a) loading a plurality of semiconductor wafers into a cylindrical tubular cantilever, and supporting said tubular cantilever at an outer end for axial movement into one end of a tube furnace for performing said processes;
   (c) introducing reactant and/or inert gases into the other end of said tube furnace; and
   (d) scavenging gases at said one end of said furnace through a plurality of openings in a scavenger chamber fixed to said one end of said tube furnace, the openings being positioned to surround the outward end of said tubular cantilever when said tubular cantilever has been moved into said one end of said furnace, said openings spaced circumferentially around said tubular cantilever but spaced therefrom for providing radially symmetrical outflow of exhaust gases from said furnace, wherein said tubular cantilever has a plurality of openings spaced circumferentially around said outward end for exhaust of gases; the scavenger chamber also scavenging gases from said one end when said tubular cantilever is removed from said tube furnace.

9. A method according to claim 8 wherein said plurality of openings include two separate groups of openings, each group arranged in a circular ring, the two groups being axially spaced from one another.

10. A method of operating a furnace of the type used for performing high-temperature processes upon semiconductor wafers, comprising the steps of:
  (a) loading a plurality of semiconductor wafers into a cylindrical tubular cantilever, and supporting said tubular cantilever at an outer end for axial movement into one end of a tube furnace for performing said processes;
  (c) introducing reactant and/or inert gases into the other end of said tube furnace; and
  (d) scavenging gases at said one end of said furnace through a plurality of openings in a scavenger chamber fixed to said one end of said tube furnace, the openings being positioned to surround the outward end of said tubular cantilever when said tubular cantilever has been moved into said one end of said furnace, said openings spaced circumferentially around said tubular cantilever but spaced therefrom for providing radially symmetrical outflow of exhaust gases from said furnace; wherein said plurality of openings include two separate groups of openings, each group arranged in a circular ring, the two groups being axially spaced from one another; wherein said openings in said tubular cantilever are positioned between said two groups openings when said tubular cantilever has been moved into said furnace; the scavenger chamber also scavenging gases from said one end when said tubular cantilever is removed from said tube furnace.

11. A method according to claim 8 wherein said tubular cantilever is a quartz tube, and wherein said furnace includes a quartz furnace liner of diameter larger than said tubular cantilever.

12. A method according to claim 8 wherein said tubular cantilever has a plurality of openings spaced circumferentially around said outward end for exhaust of gases when said tubular cantilever has been moved into said furnace.

13. A method according to claim 8 including the step of scavenging gases at said one end of said furnace through said plurality of openings when said tubular cantilever has been moved out of said furnace.

14. A scavenger chamber for use at an opening of a tube furnace or the like, comprising:
  (a) a cylindrical inner wall having a plurality of openings therein, said openings spaced circumferentially around said inner wall to provide radially symmetrical outflow of exhaust gases;
  (b) an outer wall radially outward of said inner wall;
  (c) means for exhausting gases from the space between said inner wall and said outer wall;
  (d) wherein a tubular cantilever is axially aligned with but spaced inwardly from said inner wall, and wherein said tubular cantilever has a plurality of exhaust ports positioned near said openings, said exhaust ports being circumferentially spaced about said tubular cantilever; said tubular cantilever being axially movable between a position within said tube furnace and a position withdrawn from said tube furnace, said scavenger chamber being fixed adjacent said opening of said tube furnace for exhausting gases when said tubular cantilever is in said position withdrawn from said tube furnace.

15. Apparatus according to claim 14 wherein said plurality of openings in said inner wall include two separate groups of openings, the two groups being axially spaced from one another.

16. A scavenger chamber for use at an opening of a tube furnace or the like, comprising:
  (a) a cylindrical inner wall having a plurality of openings therein, said openings spaced circumferentially around said inner wall to provide radially symmetrical outflow of exhaust gases; wherein said plurality of openings in said inner wall include two separate groups of openings, the two groups being axially spaced from one another; wherein a tubular cantilever is axially aligned with but spaced inwardly from said inner wall, and said tubular cantilever has a plurality of exhaust ports positioned near said openings, said exhaust ports being circumferentially spaced about said tubular cantilever in a ring;
  (b) an outer wall radially outward of said inner wall;
  (c) means for exhausting gases from the space between said inner wall and said outer wall;
  (d) said tubular cantilever being axially movable between a position within said tube furnace and a position withdrawn from said tube furnace, said scavenger chamber being fixed adjacent said opening of said tube furnace for exhausting gases when said tubular cantilever is in said position withdrawn from said tube furnace.

17. Apparatus according to claim 16 wherein said ring is axially positioned between said two groups of openings.

* * * * *

UNITED STATES PATENT AND TRADEMARK OFFICE
CERTIFICATE OF CORRECTION

PATENT NO. : 4,992,044
DATED : February 12, 1991
INVENTOR(S) : Ara PHILIPOSSIAN

It is certified that error appears in the above-identified patent and that said Letters Patent is hereby corrected as shown below:

Column 6, line 3, change "a" to --as--.

Column 7, line 13, delete ")" after down.

Column 8, line 49 (claim 8), change "(c)" to --(b)--;

line 51, change "(d)" to --(c)--.

Column 9, line 11 (claim 10), change "(c)" to --(b)--;

line 13, change "(d)" to --(c)--.

Signed and Sealed this

Third Day of November, 1992

Attest:

DOUGLAS B. COMER

Attesting Officer

Acting Commissioner of Patents and Trademarks